United States Patent [19]

Palazzetti et al.

[11] 4,280,853
[45] Jul. 28, 1981

[54] SOLAR ENERGY CONVERSION UNIT

[75] Inventors: Mario Palazzetti; Cesare Ponti, both of Avigliana; Pier L. Tenci, Nichelino, all of Italy

[73] Assignee: Centro Ricerche Fiat S.p.A., Orbassano, Italy

[21] Appl. No.: 133,074

[22] Filed: Mar. 24, 1980

[30] Foreign Application Priority Data

Mar. 30, 1979 [IT] Italy .................. 67669 A/79
Feb. 7, 1980 [IT] Italy .................. 67183 A/80

[51] Int. Cl.$^3$ ........................... H01L 31/04
[52] U.S. Cl. ..................... 136/246; 136/248; 136/259
[58] Field of Search ........ 136/89 PC, 89 HY, 89 CA, 136/89 CC, 246, 248; 52/173 R

[56] References Cited

U.S. PATENT DOCUMENTS

| | | | |
|---|---|---|---|
| 2,433,566 | 12/1947 | Lamb | 136/89 |
| 4,003,756 | 1/1977 | Abrams | 136/89 PC |
| 4,147,561 | 4/1979 | Knight | 136/206 |
| 4,187,123 | 2/1980 | Diggs | 136/206 |

OTHER PUBLICATIONS

"Photo-voltaic Systems", Sandia Laboratories, May 1978.

*Primary Examiner*—Aaron Weisstuch
*Attorney, Agent, or Firm*—Sughrue, Rothwell, Mion, Zinn and Macpeak

[57] ABSTRACT

A solar energy converter is provided in the form of a unit for assembly together with other similar units to build up a solar-energy conversion installation. Each unit includes a fixed support structure, a mounting element articulated on the support structure, and an optical concentrator carried by the mounting element. The optical concentrator consists of a plurality of coplanar, spherical lenses the centers of which are located at the vertices of a polygon. The center of the polygon lies on a line extending perpendicularly to the plane of the lenses through the point of articulation of the mounting element on the support structure. Each unit further includes a plurality of converter modules located at the foci of respective ones of the spherical lenses and carried by respective connecting legs which extend from the mounting element. Each converter module includes a photo-voltaic cell and means for transferring the heat dissipated in the photo-voltaic cell to a liquid.

6 Claims, 8 Drawing Figures

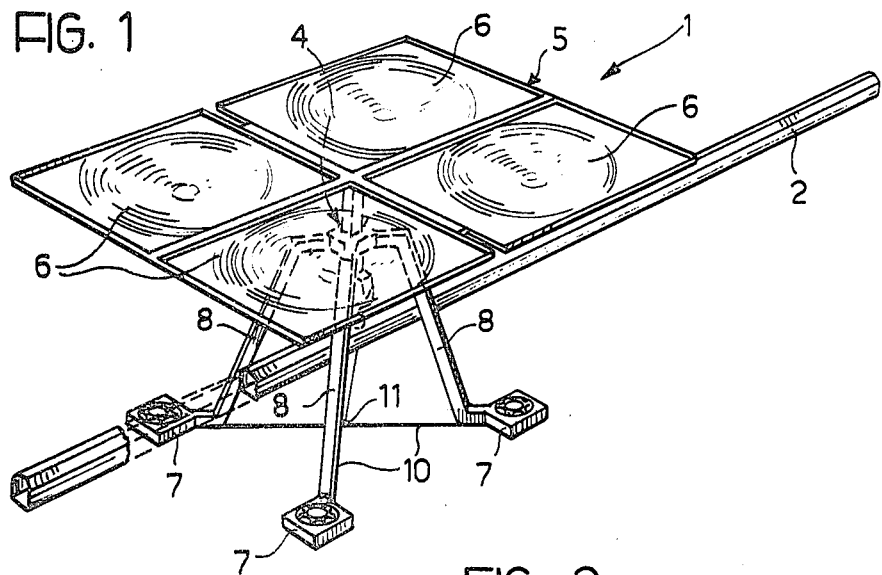
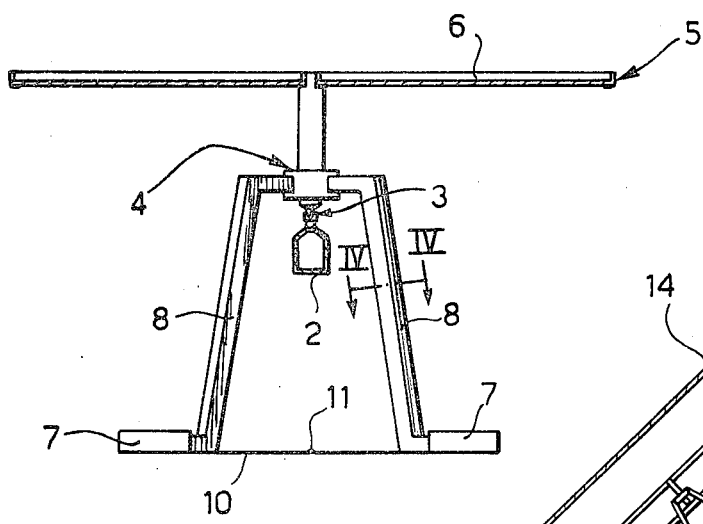
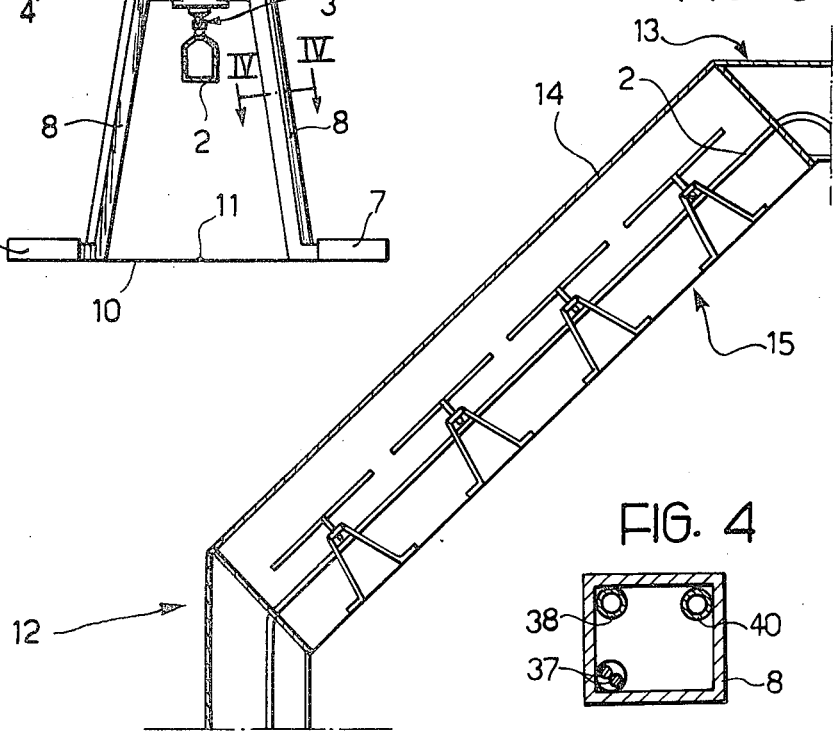

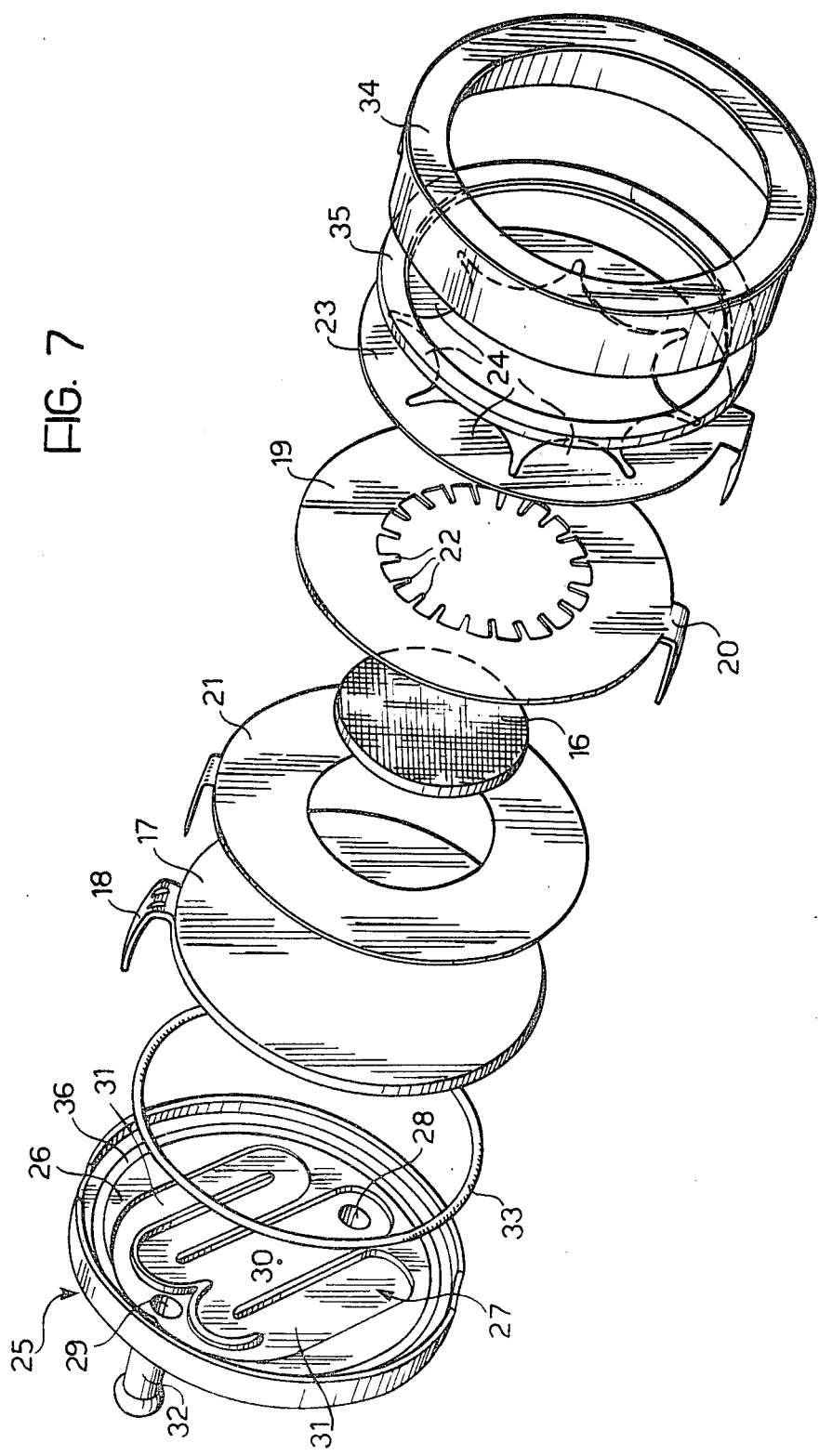

SOLAR ENERGY CONVERSION UNIT

The present invention relates to solar energy converters of the type arranged to concentrate the sun's rays onto one or more photo-voltaic cells operative to convert solar energy into electrical energy.

The object of the present invention is to provide a solar energy converter which is of simple structural form and of low bulk, and which can be readily manufactured in a form suitable for speedy erection on site.

In order to achieve this object, the present invention provides a unit for the conversion of solar energy, comprising a fixed support structure; a mounting element articulated on the support structure with at least two degrees of freedom relative thereto; an optical solar-energy concentrator fixed to the said mounting element and comprising a plurality of coplanar spherical lenses mounted with their centers mutually disposed in a geometric pattern corresponding to that formed by the vertices of a polygon, the geometric center of said pattern lying on the line perpendicular to the plane of the said lenses which passes through the centre point of articulation of the said mounting element on the support structure; a plurality of solar-energy converter modules each comprising a photo-voltaic cell; and a plurality of connecting legs extending from the mounting element and supporting respective ones of said converter modules, the converter modules being located at the foci of respective ones of the spherical lenses.

The permitted relative movement between the mounting element and the fixed support structure enables the optical solar-energy concentrator to be displaced to follow the apparent movement of the sun.

In one practical embodiment, the solar-energy conversion unit is provided with four spherical lenses which focus the solar energy onto four photo-voltaic cells carried by four connecting legs.

A solar-energy conversion unit embodying the invention, will now be particularly described, by way of example, with reference to the accompanying diagrammatic drawings, in which:

FIG. 1 is a perspective view of the conversion unit;

FIG. 2 is an elevational view of the conversion unit;

FIG. 3 shows schematically a solar-energy conversion installation made up of a plurality of units of the form illustrated in FIG. 1;

FIG. 4 is a section on line IV—IV of FIG. 2,

FIG. 7 is an exploded perspective view of the converter module illustrated in FIGS. 5 and 6.

Figure 5:
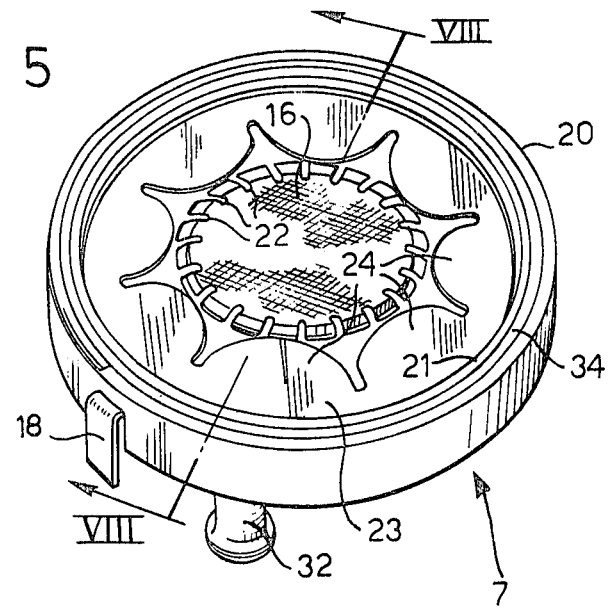
FIGS. 5, 6 are perspective views, respectively from above and from below, of one of four substantially identical solar-energy converter modules forming part of the conversion unit.

As shown in FIGS. 1 and 2, the solar-energy conversion unit 1 includes a support structure consisting of a straight hollow beam 2.

The beam 2 is connected to a mounting element 4 by means of a Cardan joint 3 which affords the element 4 two degrees of freedom relative to the beam 2. The mounting element 4 supports an optical concentrator 5 consisting of four Fresnel lenses 6 of the spherical type. The Fresnel lens can be moulded from a panel of plastics material. The centers of the lenses 6 are mutually disposed in a pattern corresponding to that formed by the vertices of a polygon (in this example, a square). The geometric centre of lens-center pattern lies on a line extending perpendicularly to the plane of the lenses 6 through the centre of articulation of the mounting element 4 on the beam 2.

At the four foci of the four Fresnel lenses 6 are located respective solar-energy converter modules 7. These modules 7 are mounted at the ends of four connecting legs 8 which extend from the mounting element 4.

The articulated connection of the support element 4 to the beam 2 allows the optical concentrator 5 to be displaced so as to follow the apparent movement of the sun. In order to control this displacement, any of the known control means usually used with concentrating-type solar converters may be used. Preferably these control means act at the centre of the notional square at the vertices of which are located the converter modules 7. For this purpose, the converter modules 7 diagonally opposite each other may be connected by means of cables 10 which meet at a point 11 at which the displacement control means preferably acts.

The structure of the described conversion unit is thus particularly simple to construct and mount. Furthermore, although the entire conversion unit has a relatively small bulk, solar-energy conversion installations with large solar-energy collecting surfaces can be achieved by coupling together a plurality of conversion units 1 of the form illustrated in FIG. 1. In this case, the small bulk of each unit greatly simplifies erection of the installation.

FIG. 3 shows an installation composed of a plurality of conversion units of the FIG. 1 form. The installation is provided in a building 12 having a roof 13 including a sloping section 14 formed by a glass wall. Below this glass wall is located the solar-energy conversion installation 15 which consists of a plurality of conversion units 1 disposed in parallel rows (only one of these rows is shown in FIG. 3). Each row of conversion units 1 is supported by a single beam 2. It will be appreciated that the described structural form of the units 1 makes it possible to erect an installation of the type shown in FIG. 3 speedily and simply. The simple structural form of the conversion units thus has considerable economic advantages in relation to the construction of solar-energy conversion installations.

A further advantage of the described conversion unit 1 lies in the fact that the use of the Fresnel lenses 6 for concentrating the solar energy allows the diffuse component of the solar energy to pass through, so that the use of an installation of the type shown in FIG. 3 does not unacceptably reduce the light within the building.

Figure 6:
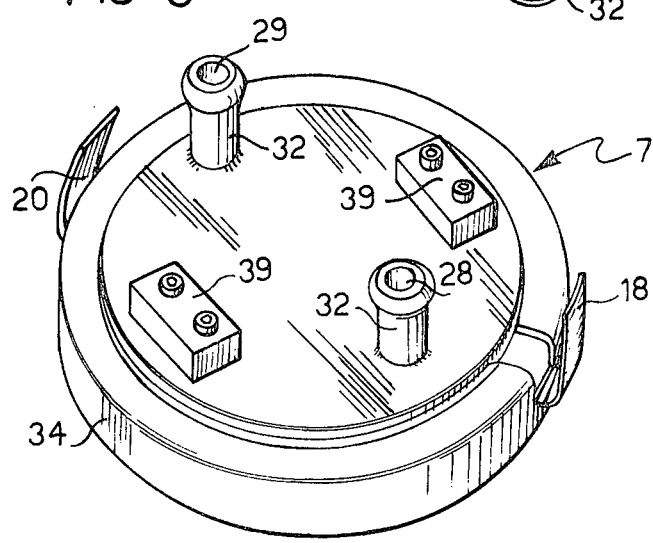
Figure 8:
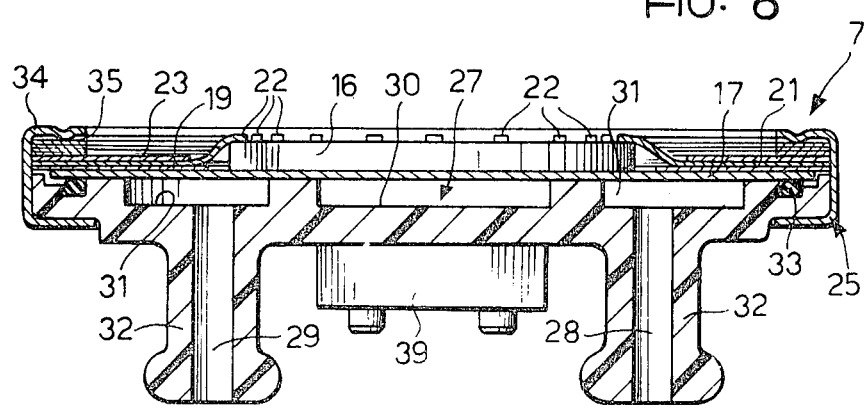
FIG. 8 is a section on line VIII—VIII of FIG. 5.

FIGS. 5 to 8 illustrate one of the converter modules 7.

Each of these converter modules 7 includes a photo-voltaic cell 16 for converting solar energy into electrical energy. The photo voltaic cell 16 is mounted centrally on a circular copper plate 17 which acts as one electrode contact for the cell 16. At its outer edge the plate 17 is provided with a contact lug 18 by means of which external electrical connection can be made to the plate 17. The other electrode contact for the cell 16 is constituted by an annular metallic plate element 19 which is supported on the plate 17 with the interposition of an annular element 21 of electrically-insulating material. The annular element 19 is provided at its outer edge with a contact lug 20 to enable external electrical connection to be made to the element 19.

Around its inner edge the annular element 19 has a series of radially inwardly projecting fingers 22 which clamp the photo-voltaic cell 16 against the plate 17. This form of mounting arrangement avoids any difficulties relating to possible reductions in size of the photo-voltaic cell or to sliding of the cell relative to the plate 17.

An auxiliary annular plate element 23, also of metallic material, is formed around its inner periphery with resilient tongues 24 which press the radial fingers 22 of the element 19 against the photo-voltaic cell 16.

The two annular elements 19, 23 are preferably made of copper or of a copper and beryllium material with at least 10% of beryllium. In the second case the material must have previously been subjected to a thermal treatment to induce the precipitation of the beryllium. This ensures maximum elasticity of the fingers 22 and tongues 24 and, at the same time, confers the maximum degree of electrical conductivity.

Preferably the insulating material used for the element 21 is that known by the mark MYLAR.

In an experimental solar energy converter module 7 made by the applicants, the photo-voltaic cell 16 has a diameter of 51 mm and a thickness of 1 mm. The thickness of the copper plate 17 is 1.5 mm while the thickness of the annular element 21 of insulating material is 0.05 to 0.1 mm. The combined thickness of the annular elements 19, 23 is 1.4 to 1.5 mm.

Each converter module 7 includes a back plate 25 of insulating material. The back plate 25 is in the form of a flat disc-shaped body into one face of which is cut a channel 27 (see FIG. 7). The metallic plate 17 bears against this face 26 of the back plate 25 so as to cover the channel 27 and thus define a closed passage through which a liquid can flow. The back plate is provided with two apertures 28 and 29 which open into the channel 27 so as to form an inlet and outlet respectively for liquid which is to pass through the said closed passage.

The channel 27 includes a first section 30 which extends diametrally from the inlet bore 28 towards the outlet bore 29 and two sections 31, which double back on themselves to communicate the first section 30 with the outlet aperture 29. The channel sections 31 are located in respective halves of the face 26 separated by the first channel section 30. Due to this arrangement, liquid flowing through the tortuous passage defined by the channel 27 divides into two flows which pass through respective sections 31 and reunite in the region of the the outlet aperture 29.

On its surface opposite the face 26 the back plate 28 is provided with a pair of tubular connector stubs 32 which extend parallel to the axis of the disc and are coaxial with the apertures 28, 29. These connector stubs 32 permit liquid to be conducted to and from the channel 27. In addition, the back plate 25 has two mounting blocks 39 by means of which the body 25 is arranged to be secured to the corresponding connecting leg 8 of the unit 1.

The back plate 24 is preferably made from a thermoplastics material, of the type known by the trade mark MILNON, and is formed in a single piece by moulding. An annular seal 33 is located between the back plate 25 and the copper plate 17 in correspondence with the outer peripheral edge of this latter.

The pack of conversion-unit components described above is clamped together by means of a metallic annular retaining ring 34, for example of iron cadmiate, which takes up the reaction forces of the resilient element 23. Between the annular plate element 23 and the adjacent ring 34 is interposed an annular element 35 of insulating material.

The annular seal 33 preferably consists of an annular O-ring of a material which is capable of withstanding rapid temperature changes even of 80° C. without fatigue (for example the material known by the trade mark VULCOLAN). The annular seal 33 is located in a circumferential groove 36 formed in the back plate 25, the cross-section of the groove being such as to ensure compression of the seal 33 when the module 7 is assembled.

The surface of the plate 17 which faces the back plate 25 is covered with a layer of insulating material so as to prevent electrolysis occurring during operation of the converter module 7. This layer of insulating material should be very thin so as not to unduly inhibit the passage of heat dissipated by the photo-voltaic cell 16 to the plate 17. For this purpose, the insulating material consists of an extremely thin film formed by the process usually used for coating pots and pans for domestic use.

With a view to avoiding air bubbles within the liquid flow, the cross-sectional area of the passage defined by the channel 27 is made less than 2% to 3% of that of the apertures 28 and 29.

During the operation of the converter module 7, the photo-voltaic cell 16 converts part of the solar energy focussed onto it by the corresponding lens 6, into electrical energy for supply to an external circuit via the contact lugs 18 and 20. At the same time, the heat dissipated by the photo-voltaic cell 16 is transmitted through the copper plate 17 to a working liquid which is circulated through the passage defined by the channel 27 in the back plate 25.

The described form of each solar-energy converter module 7 facilitates its manufacture in a simple and economic manner.

The electrical cables connected to the photo-voltaic cells 16, and the tubing for the working liquid cooling these cells 16, are located within the connecting legs 8 and the mounting element 4. The working liquid (which, may for example, be water) is arranged to traverse the four converter modules 7 in series and to this end the tubing conducting the working liquid, passes from the beam 2 to the mounting element 4 from where it successively traverses each connecting leg 8 in both directions before returning to the interior of the beam 2.

FIG. 4 shows a connecting leg 8 in cross-section. Located within the leg 8 is a two-core electrical cable 37 connecting with the two contact lugs 18 and 20 of the photo-voltaic cell 16. The leg 8 also houses a liquid supply tube 38 communicating with the inlet aperture 28 of the corresponding module 7 and a liquid return tube 40 communicating with the outlet aperture 29 of the module 7. The tubes 38 and 40 are both flexible.

We claim:

1. A solar-energy conversion unit comprising
a fixed support structure;
a mounting element articulated on said support structure with at least two degrees of freedom relative thereto;
an optical solar-energy concentrator fixed to the said mounting element and comprising a plurality of coplanar spherical lenses mounted with their centers mutually disposed in a geometric pattern corresponding to that formed by the vertices of a polygon, the geometric center of said pattern lying on the notional line perpendicular to the plane of the said lenses which passes through the center of articulation of the said mounting element on the support structure;

a plurality of solar-energy converter modules each comprising a photo-voltaic cell; and a plurality of connecting legs extending from said mounting element and supporting respective ones of said converter modules in a common plane parallel to said lenses with each converter module being located at the foci of respective ones of the spherical lenses and with the point of articulation of the mounting element to the support structure being located between said plane and said lenses.

2. A solar-energy conversion unit according to claim 1, including four said lenses and four said photovoltaic cells, each cell being mounted on a respective one of four legs.

3. A solar-energy conversion unit according to claim 1, wherein said spherical lenses are Fresnel lenses.

4. A solar-energy conversion unit according to claim 1, wherein said fixed support structure consists of a rectilinear beam.

5. A solar-energy conversion unit according to claim 1, wherein said mounting element is articulated on said fixed support structure by means of a Cardan joint.

6. A solar-energy conversion unit according to claim 1, wherein each converter module further comprises heat transfer means arranged to transfer heat dissipated in the photo-voltaic cell of the module to a liquid.

* * * * *